United States Patent [19]

Chen

[11] Patent Number: 5,425,038
[45] Date of Patent: Jun. 13, 1995

[54] ERROR PLUS SINGLE BIT ERROR DETECTION

[75] Inventor: Chin-Long Chen, Fishkill, N.Y.

[73] Assignee: International Business Machines Corporation, Armonk, N.Y.

[21] Appl. No.: 87,442

[22] Filed: Jul. 2, 1993

[51] Int. Cl.⁶ .............................................. G06F 11/10
[52] U.S. Cl. ................................. 371/37.1; 371/49.1; 371/50.1
[58] Field of Search ................... 371/37.1, 40.1, 49.1, 371/51.1, 49.2, 50.1

[56] References Cited

U.S. PATENT DOCUMENTS

| | | | |
|---|---|---|---|
| 4,464,753 | 8/1984 | Chen | 371/40.1 |
| 4,754,458 | 6/1988 | Dornstetter | 371/39.1 |
| 4,998,253 | 3/1991 | Ohashi et al. | 371/43 |
| 5,148,434 | 9/1992 | Richard | 371/27 |

*Primary Examiner*—Paul P. Gordon
*Attorney, Agent, or Firm*—Lawrence D. Cutter

[57] ABSTRACT

In accordance with a preferred embodiment of the present invention, a mechanism is provided for converting Type II binary parity check matrices for a large class of codes into a larger parity check matrix which is more suitable for error detection and correction in memory systems which employ multiple bit per chip output architecture. More particularly, the present coding method provides codes which exhibit check bit requirements which are less than those for a Type II code but greater than those for a Type I code. In particular, the codes of the present invention are capable of detecting all combinations of a single symbol error and a single bit error. In addition, the codes for the present invention exhibit all of the correction and detection properties for a Type I code but do not rise to the capabilities or the complexities of Type II codes which are capable of correcting all single symbol errors and detecting all double symbol errors. In particular, the present invention avoids the weakness found a in Type I code which occurs in those situations in which there is a symbol error from a symbol bit group and another error from a different symbol.

14 Claims, 9 Drawing Sheets

FIG. 1A $$H_{II} = \begin{bmatrix} I_3 & I_3 & I_3 & I_3 & I_3 & I_3 & I_3 \\ O_3 & I_3 & I_3 & I_3 & I_3 & I_3 & I_3 \\ O_3 & O_3 & I_3 & I_3 & I_3 & I_3 & I_3 \\ I_3 & I_3 & I_3 & T^3 & T^4 & T^5 & T^3 \\ T^4 & T^4 & T^3 & T^3 & T^4 & T^3 & T^3 \\ T^5 & T^3 & T^5 & T^5 & T^5 & T^3 & T^3 \\ T^5 & T^3 & T^3 & T^3 & T^5 & T^3 & T^5 \end{bmatrix}$$

FIG. 1D $$H_{II} = \begin{bmatrix} M \times M & M \times M & \cdots & M \times M \\ M \times M & M \times M & \cdots & M \times M \\ \vdots & \vdots & & \vdots \\ M \times M & M \times M & \cdots & M \times M \end{bmatrix}$$

$N = SM$ (rows), $N - K = MP$ (columns)

FIG.1B $$T^0 = \begin{bmatrix} 1 & 0 & 0 \\ 0 & 1 & 0 \\ 0 & 0 & 1 \end{bmatrix}$$

$$T = \begin{bmatrix} 0 & 0 & 1 \\ 1 & 0 & 1 \\ 0 & 1 & 0 \end{bmatrix}$$

$$T^2 = \begin{bmatrix} 0 & 1 & 0 \\ 0 & 1 & 1 \\ 1 & 0 & 1 \end{bmatrix}$$

$$T^3 = \begin{bmatrix} 1 & 0 & 1 \\ 1 & 1 & 1 \\ 0 & 1 & 1 \end{bmatrix}$$

$$T^4 = \begin{bmatrix} 0 & 1 & 1 \\ 1 & 1 & 0 \\ 1 & 1 & 1 \end{bmatrix}$$

$$T^5 = \begin{bmatrix} 1 & 1 & 1 \\ 1 & 0 & 0 \\ 1 & 1 & 0 \end{bmatrix}$$

FIG. 1C $$H_{II} = \begin{bmatrix} 100 & 100 & 100 & 100 & 100 & 100 & 100 & 100 & 100 \\ 010 & 010 & 010 & 010 & 010 & 010 & 010 & 010 & 010 \\ 001 & 001 & 001 & 001 & 001 & 001 & 001 & 001 & 001 \\ \hline 000 & 100 & 000 & 100 & 000 & 100 & 000 & 100 & 000 \\ 000 & 010 & 000 & 010 & 000 & 010 & 000 & 010 & 000 \\ 000 & 001 & 000 & 001 & 000 & 001 & 000 & 001 & 000 \\ \hline 000 & 000 & 100 & 100 & 100 & 100 & 111 & 111 & 111 \\ 000 & 000 & 010 & 010 & 010 & 010 & 111 & 111 & 111 \\ 000 & 000 & 001 & 001 & 001 & 001 & 111 & 111 & 111 \\ \hline 000 & 000 & 000 & 000 & 111 & 111 & 100 & 100 & 100 \\ 000 & 000 & 000 & 000 & 111 & 111 & 010 & 010 & 010 \\ 000 & 000 & 000 & 000 & 111 & 111 & 001 & 001 & 001 \\ \hline 000 & 000 & 000 & 100 & 111 & 110 & 111 & 100 & 110 \\ 000 & 000 & 000 & 010 & 111 & 101 & 111 & 010 & 101 \\ 000 & 000 & 000 & 001 & 111 & 011 & 111 & 001 & 011 \end{bmatrix}$$

FIG. 2A $$H_{III} = \begin{array}{c} \underbrace{\begin{array}{cc} \overbrace{(b)\times(b)}^{b} & \overbrace{M\times(b) \cdots M\times(b)}^{(P-1)M} \\ \vdots & \vdots \\ (b)\times(b) & M\times(b) \cdots M\times(b) \\ \vdots & \vdots \\ (b)\times(b) & M\times(b) \cdots M\times(b) \end{array}}_{MP+(b-M)} \end{array} \Bigg\} Sb$$

FIG. 2B $$\text{AUG}(T^0) = \begin{bmatrix} 1 & 0 & 0 & | & 1 \\ 0 & 1 & 0 & | & 1 \\ 0 & 0 & 1 & | & 0 \end{bmatrix}$$

$$\text{AUG}(T) = \begin{bmatrix} 0 & 0 & 1 & | & 0 \\ 1 & 0 & 1 & | & 1 \\ 0 & 1 & 0 & | & 1 \end{bmatrix}$$

$$\text{AUG}(T^2) = \begin{bmatrix} 0 & 1 & 0 & | & 1 \\ 0 & 1 & 1 & | & 1 \\ 1 & 0 & 1 & | & 1 \end{bmatrix}$$

$$\text{AUG}(T^3) = \begin{bmatrix} 1 & 0 & 1 & | & 1 \\ 1 & 1 & 1 & | & 0 \\ 0 & 1 & 1 & | & 1 \end{bmatrix}$$

$$\text{AUG}(T^4) = \begin{bmatrix} 0 & 1 & 1 & | & 1 \\ 1 & 1 & 0 & | & 0 \\ 1 & 1 & 1 & | & 0 \end{bmatrix}$$

$$\text{AUG}(T^5) = \begin{bmatrix} 1 & 1 & 1 & | & 0 \\ 1 & 0 & 0 & | & 1 \\ 1 & 1 & 0 & | & 0 \end{bmatrix}$$

$$\text{AUG}(O_3) = \begin{bmatrix} 0 & 0 & 0 & | & 0 \\ 0 & 0 & 0 & | & 0 \\ 0 & 0 & 0 & | & 0 \end{bmatrix}$$

$$\text{AUG}(I_3) = I_4$$

FIG. 2C $$H_{III}^{*} = \begin{bmatrix} 1000 & 1000 & 1000 & 1000 & 1000 & 1000 & 1000 & 1000 & 1000 & 1000 \\ 0100 & 0100 & 0100 & 0100 & 0100 & 0100 & 0100 & 0100 & 0100 & 0100 \\ 0010 & 0010 & 0010 & 0010 & 0010 & 0010 & 0010 & 0010 & 0010 & 0010 \\ 0001 & 0001 & 0001 & 0001 & 0001 & 0001 & 0001 & 0001 & 0001 & 0001 \\ 0000 & 1001 & 0000 & 1001 & 1011 & 1011 & 0111 & 0111 & 1110 & 1110 \\ 0000 & 0101 & 0000 & 0101 & 1110 & 1110 & 1100 & 1100 & 1001 & 1001 \\ 0000 & 0010 & 0000 & 0010 & 0111 & 0111 & 1110 & 1110 & 1100 & 1100 \\ 0000 & 0000 & 1001 & 0111 & 0111 & 1110 & 1001 & 1011 & 1011 & 1110 \\ 0000 & 0000 & 0101 & 1100 & 1100 & 1001 & 0101 & 1110 & 1110 & 1001 \\ 0000 & 0000 & 0010 & 1110 & 1110 & 1100 & 0010 & 0111 & 0111 & 1100 \end{bmatrix}$$

Width: $40 = 30 + 10$
Height: $30 - 21 + 1 = 10 = 9 + 1$

FIG. 3

$$H_{OPT} = \begin{bmatrix} 1000 & 0001 & 0001 & 0110 & 0100 & 1101 & 0110 & 0100 & 1101 & 1000 \\ 0100 & 0001 & 0001 & 1101 & 0110 & 0011 & 1101 & 0110 & 0011 & 0100 \\ 0010 & 0000 & 0000 & 1110 & 1011 & 1001 & 1110 & 1011 & 1001 & 0010 \\ 0001 & 0001 & 0001 & 0001 & 0001 & 0001 & 0001 & 0001 & 0001 & 0001 \\ 0000 & 1001 & 0000 & 1001 & 1011 & 1011 & 0111 & 0111 & 1110 & 1110 \\ 0000 & 0101 & 0000 & 0101 & 1110 & 1110 & 1100 & 1100 & 1001 & 1001 \\ 0000 & 0010 & 0000 & 0010 & 0111 & 0111 & 1110 & 1110 & 1100 & 1100 \\ 0000 & 0000 & 1001 & 0111 & 0111 & 1110 & 1001 & 1011 & 1011 & 1110 \\ 0000 & 0000 & 0101 & 1100 & 1100 & 1001 & 0101 & 1110 & 1110 & 1001 \\ 0000 & 0000 & 0010 & 1110 & 1110 & 1100 & 0010 & 0111 & 0111 & 1100 \end{bmatrix}$$

ERROR PLUS SINGLE BIT ERROR DETECTION

BACKGROUND OF THE INVENTION

The present invention is generally directed to error correction coding methods that are useful in conjunction with memory array structures for digital computers systems. More particularly, the present invention is especially applicable to those situations in which a memory organization includes multiple bit read-out from memory array units. Typically such memory array units comprise individual circuits chips.

The use of error detection and correction mechanisms in conjunction with computer memory circuits has become more prevalent and more desirable as chip circuit densities have increased. This increase in circuit density, both at the present time, and as it is expected to proceed in the future, gives rise to situations in which various kinds of memory errors can occur. These errors will undoubtedly include errors of the "soft" variety which are typically induced by alpha particle emission or other radiation but will also include hard memory failure conditions. Both of these kinds of errors can result in an error indication. Because of these increased error risks in memory systems, it becomes even more necessary to try to maintain the integrity and reliability of data that is stored in memory array structures, particularly those memory systems based upon high density semiconductor circuit chip devices.

Since memory density has increased the number of memory cells that can be placed on individual circuit chips, it has become apparent that it is often desirable to organize computer memory systems in such a way that more than a single bit of information is provided at one time from a given memory chip. Accordingly, multibit per chip memory systems are becoming more prevalent. In such situations, it is often desirable to consider the multiple bits as representing a "symbol". Thus, in a 64-bit wide memory based upon 4 bits per chip modules, the output could be considered as being supplied in sixteen 4-bit "symbol chunks".

In the past, when error correction and detection methods have been applied to memory circuits and to memory structures, coding methods have generally fallen into two general categories: Type I and Type II. In a Type I code, the encoding and decoding mechanisms are constructed so that the codes are capable of correcting all single errors, detecting all double-bit errors and also capable of detecting all single symbol errors, where a symbol error is an error in up to b-bits from a b-bit per chip memory system. Such codes are referred to herein as Type I codes. On the other hand, a Type II code is capable of doing all of the things that a Type I code can but is also capable of correcting all single symbol errors and detecting all double symbol errors.

Thus, in a Type I code the capability is present for correcting all errors that occur in a single bit, detecting all errors that occur in two bit positions, and detecting all errors as long as they occur within a single set of b bits. In contrast, a Type II code is capable of correcting all errors that occur within a single symbol and is also capable of detecting all errors that occur within two separate symbols.

However, there is a need for a third type of code whose capabilities lie between those of a Type I code and a Type II code. Such codes are referred to herein as Type III codes. Accordingly, such codes can correct all errors in a single bit position, can detect all errors in two bit positions, can detect all errors that occur within a single symbol (b-bits), and lastly, can detect all combinations of errors that occur within a single symbol and at another single bit location. Thus, a Type III code, as defined herein, would be able to detect all combinations of a single symbol error and an error in one other bit position. In contrast, a full Type II code would be able to correct all single symbol errors and detect all double symbol errors.

It is important to be able to have the capability to exploit Type III codes since the existence of such codes provides the memory ECC designer with a powerful and flexible tool that he did not heretofore possess. In particular, the existence of Type III codes also provides code designers with engineering decision options that were not heretofore available. Code designers, and code designers working in the area of memory circuit protection, have found that a Type I code, while relatively inexpensive to implement, nonetheless does not necessarily provide the degree of error correction and detection that has become expected in memory systems, especially in memory systems that are employed in large mainframe computers where multiuser environments make data integrity even more critical. Likewise, code designers working in the memory protection area have found that Type II coding methods, while significantly enhancing error correction and detection capabilities, nonetheless require complicated circuitry which consumes more than a desirable amount of memory chip "real estate". Furthermore, it should be seen from the discussion above that, with the increased reliance upon multi-bit memory architectures, the ability to detect all combinations of a single symbol error, together with the error in another single error in a bit position, becomes significantly more advantageous. In short, it should be seen from the discussion above that Type III error correction coding methods are particularly applicable to multi-bit memory architectures.

SUMMARY OF THE INVENTION

In accordance with a preferred embodiment of the present invention, a method is provided for encoding binary data which occurs in a block of N bits and which is further subdivided into S subblocks of M bits each. The method comprises the steps of subjecting these N bits of data to parity check conditions which are determined by a specific parity check matrix H. This matrix is derived from another specific binary matrix H*. In particular, the matrix H* represents the parity check matrix for a Type II code in which the first row includes S columns of M×M identity matrices and wherein the other rows of the matrix H* include M×M zero matrices, M×M identity matrices, and M×M matrices $T^i$ where i denotes a non-negative exponent and T is a companion matrix associated with a primitive polynomial p(x) over the Galois Field GF(2). Thus, the H* matrix from which the binary parity check matrix H of the present invention is derived, includes P rows and S columns of M×M submatrices with the first row of submatrices being identity matrices.

In accordance with the present invention, the desired parity check matrix H is derived from the H* matrix by replacing the M×M identity matrices in the first row of submatrices with b×b identity matrices, where $M+1 \leq b < 2^M - 1$; replacing the M×M zero matrices with M×b zero matrices and lastly, replacing the M×M matrices $T^i$ with M×b augmented matrices which are the same as the $T^i$ matrices but which have additional columns added—each of these columns being the vector of the polynomial $x^j$ modulo p(x) for some j, $1 \leq j \leq b$. Here, in accordance with well-known coding methods, p(x) is a primitive binary polynomial over the field of binary numbers. The resultant desired parity check matrix H is thus a matrix with Sb columns and MP+(b−M) rows. Thus, the matrix H will have, with respect to the matrix H* an additional (b−M)S columns and one (b−M) additional rows. It is these additional elements which give rise to the added capabilities of the Type III code described herein.

One of the desired advantages of the code just described is the ease with which it can be decoded. In particular, if the syndrome, as calculated from an input code vector and the parity check matrix, is the vector of all zeros, then there is no error indication provided. However, if the syndrome is not an all zero vector, then the syndrome is compared with the column vector i of the matrix H for all Sb columns of H. If the syndrome is exactly the same as column i of H, then bit i of the codeword is in error, and accordingly bit i is corrected by a bit inversion. Accordingly, it is seen that a correcting circuit would typically include a conditional inverter or Exclusive-Or gate in its output portion. Furthermore, if it turns out that the non-null syndrome does not match any of the columns of H, there is provided an indication that there is an uncorrectable error present in the codeword received from the memory array.

Accordingly, it is an object of the present invention to improve the reliability of memory arrays.

It is another object of the present invention to provide a coding method for binary information which is intermediate in terms of complexity and cost between Type I codes and Type II codes.

It is yet another object of the present invention to be able to employ error correction coding methods which are particularly suitable for memory array structures in which output symbols are grouped in chunks of b bits.

It is a still further object of the present invention to be able to enhance the characteristics of Reed-Solomon codes.

It is yet another object of the present invention to provide a method for error correction and detection based upon Type III codes.

Lastly, but not limited hereto, it is an object of the present invention to be able to detect all combinations of single symbol errors and at the same time to be able to detect single bit errors that occur anywhere else in the codeword.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 1A shows a typical Reed-Solomon parity check matrix for a Type II code;

FIG. 1B illustrates the companion matrix T and its various powers for substitution into the matrix of FIG. 1A to describe a Type II parity check matrix in its binary form;

FIG. 1C illustrates the result of substituting the powers of T shown in FIG. 1B into the matrix structure of FIG. 1A;

FIG. 1D illustrates the overall structure and sizing requirements for a Type II parity check matrix in terms of its various substructures;

FIG. 2A illustrates the parity check matrix structure for a Type III code in accordance with the present invention;

FIG. 2B illustrates the various augmented matrices for the companion matrix T which, for the example herein, is associated with the primitive polynomial $p(x) = 1 + x + x^3$;

FIG. 2C represents a typical parity check matrix for a (40, 30) Type III code;

FIG. 3 represents a binary parity check matrix of the same form as FIG. 2C except that it is optimized in terms of reducing the number of binary ones that occur in the matrix;

DETAILED DESCRIPTION OF THE INVENTION

Figure 4:
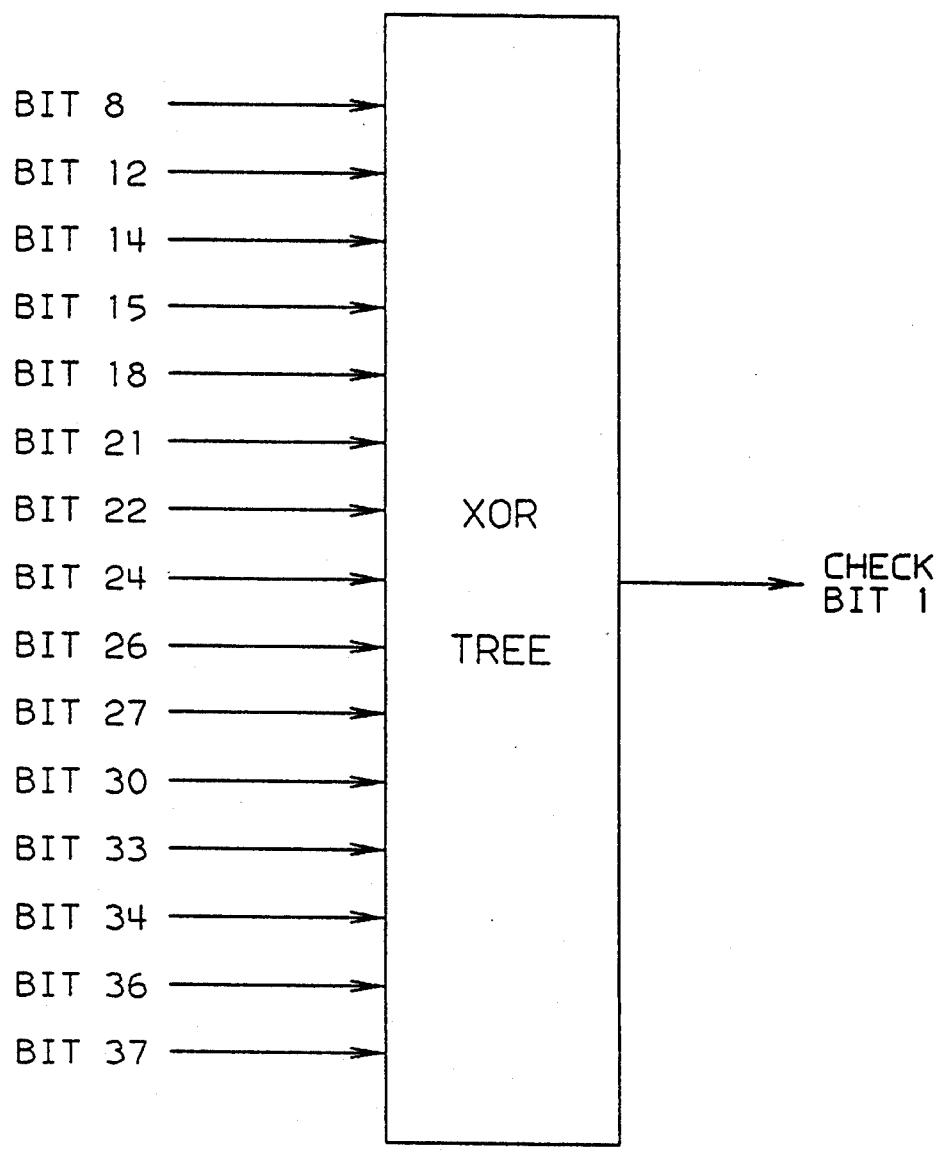
FIG. 4 illustrates an exclusive-OR tree for check bit 1 which is associated with the parity check matrix of FIG. 3.

For purposes of understanding the present invention, the construction of a Type III code is developed in terms of its construction from a given Type II code of smaller symbol size. In accordance with well understood notation employed in the art of error correction code design, an (N, K) code is a code with N bits representing the length of the code vector and with a total of K information bits present in the code. Such a code would typically have a parity check matrix with N columns and N−K rows. The expression N−K represents what is effectively the number of check bits. In particular, a (30, 21) Type II code (30 total bits, 21 information bits 9 (nine) check bits) with a symbol size of 3 bits per symbol is converted into a (40, 30) Type III code with a symbol size of 4 bits per symbol. However, the notion of what is a check bit and what is an information bit is strictly speaking only relevant in those situations where the parity check matrix is expressed in a reduced echelon form, that is, with a leading identity matrix in its leftmost columns. It is noted however, that it is also possible to have the identity matrix distributed throughout the various columns of the parity check matrix. Without affecting the properties of the code or its implementation, such transpositions in the parity check matrix merely correspond to a different mapping of the bit positions in the code.

As a basis code for starting the discussion, FIG. 1A illustrates a parity check matrix for a (30, 21) Type II Reed-Solomon code. Each symbol $I_3$ represents a 3×3 identity submatrix. Each symbol $O_3$ represents a 3×3 matrix all of whose elements are zeros. The matrices $T^i$ represent the various powers of a companion matrix T. These powers of T are illustrated more in detail in FIG.

1B. Solely for the purposes of the present example, the matrix T is the companion matrix associated with a third degree primitive polynomial, for example, $p(x)=1+X+X^3$. The lower, leftmost portion of the matrix T is a standard $2\times 2$ identity submatrix. The last column of T, that is its rightmost column, is a listing of the coefficients of the primitive polynomial with the low order coefficients being listed near the top row of T and wherein it is not necessary to list the highest order coefficient, which in this case would be the coefficient of $x^3$.

As a consequence of the structure of the Type II code shown in FIG. 1A, it is seen that the parity check matrix of this code comprises a matrix of S submatrix columns with each subcolumn being an $M\times M$ matrix. In this arrangement there are a total of M symbols with S bits per symbol, for a total of SM bits. As applied to the code illustrated in the check matrix in FIG. 1A, the total number of bit positions, that is the number of columns of $H_{II}$ is N which is thus equal to SM where M is the number of symbols and S is the number of bits per symbol. Likewise, there are (N−K) rows in $H_{II}$ and this number is a multiple P of the number of bits per symbol. Thus, N−K=PM. For the specific Type II code illustrated and discussed herein, N=30, S=10, M=3 and P=3. Thus, N−K=9 and K=21. It is further noted that the code shown in FIG. 1A, which is more explicitly expanded in FIG. 1C, is generally describable as a Reed-Solomon code.

In accordance with the present invention, Type II codes which are generally of the form shown in FIG. 1D, are modified to create a new parity check matrix which describes a Type III code. In particular, the S identity matrices in the first row of $H_{II}$ are increased by one to form b by b identity sub-matrices (see FIG. 2A), where b is an integer greater than M and less than $2^M$−1. Thus, the construction procedure employed increases the number of code vector components by the amount (b−M)S. In the example herein, S=10 corresponding to the number of symbols in the original code.

Further modifications, as are now described, are carried out on the other rows in the originally given Type II parity check matrix for the case b=M+1. In particular, the $M\times M$ zero matrices are increased in size by adding an additional column of zeros to the matrices to produce zero matrices which have M rows and (M+1) columns. Lastly, the matrices $T^i$ representing various powers of the T companion matrix are also modified by adding a rightmost column vector, having M components to each matrix $T^i$. However, as i varies from 0 to 5 (in this case), different columns are appended depending upon the value of i. Generally, each matrix $T^i$ is transformed into an $M\times b$ matrix whose $j^{th}$ column is the vector of the polynomial $x^{i+j-1}$ taken modulo p(x). This means that the single term polynomial $x^{i+j-1}$ is divided by the aforementioned primitive polynomial p(x) and a corresponding remainder polynomial is generated. It is the coefficients of this remainder polynomial which are employed, as described above, to generate a set of augmented $T^i$ matrices (AUG($T^i$) in FIG. 2B). For the Type III code being constructed herein, the augmentation of the matrices T occurs as is shown in FIG. 2B wherein augmentation in the sense described above is indicated by the symbol "AUG". Also, to avoid any confusion on the point, in the code construction approach of the present invention, it should generally be appreciated that the $M\times M$ matrix $T^0$ is defined herein to be the M $\times$M identity matrix.

Thus, in accordance with the general construction method carried out in accordance with the present invention, a Type II parity check matrix with S columns and P rows of ($M\times M$) sub-matrices is transformed into a matrix with bS columns and MP+(b−m) rows of binary field elements. These rows and columns occur in the form of a first row of $b\times b$ identity matrices arranged in S columns. In a somewhat similar fashion, the other (P−1) rows of sub-matrices are converted into $M\times b$ sub-matrices wherein the augmentation (in the number of columns from M to M+1) is carried out as described above. Accordingly, in the transformation carried in the present invention, a matrix with N=SM columns and PM=(N−K) rows is transformed into a parity check matrix for a Type III code having Sb columns and MP+(b−m) rows. This is illustraed in FIG. 2A.

The parity check matrix which results from this transformation example is shown in its binary form in FIG. 2C where it is defined as $H_{III}'$. This is a matrix of 40=(10) (4) columns and 10=4+(3−1)3=3 (3) +(4−3) rows. The dashed lines in FIG. 2C are meant solely for illustrative purposes to more particularly indicate the sub-matrices which constitute the overall parity check matrix. This matrix may be further transformed by row operations to form the matrix $H_{opt}$ shown in FIG. 3.

The check bits and the syndrome bits of a Type III code are generated by Exclusive-OR operations on the data bits specified by the row vectors of the parity check matrix. This is the same as the regular procedures carried out for other types of binary codes.

One of the features of the present invention is the relative ease with which decoding may be carried out. In particular, once the syndrome bits are generated (see step 10 in FIG. 5) it is next determined whether or not the syndrome is null (step 20), that is, if it is a vector of all zeros. If it is, no error indication is provided (step 30) and the received input sequence is interpreted as the correct sequence of bits.

However, if the syndrome is not null, then the syndrome is compared with all of the column vectors of the parity check matrix (step 40). It is next determined whether any of the columns of the parity check matrix match the syndrome (step 50). If there is no match, an uncorrectable error has occurred and a signal indicating this situation is preferably provided (step 60). If matching columns are found, then the bit for the corresponding matched column is inverted (step 70) to provide a corrected sequence. However, this correction capability is limited to correcting any single bit error. Nonetheless, the error correction capabilities are those of the Type III codes described above.

Figure 6:
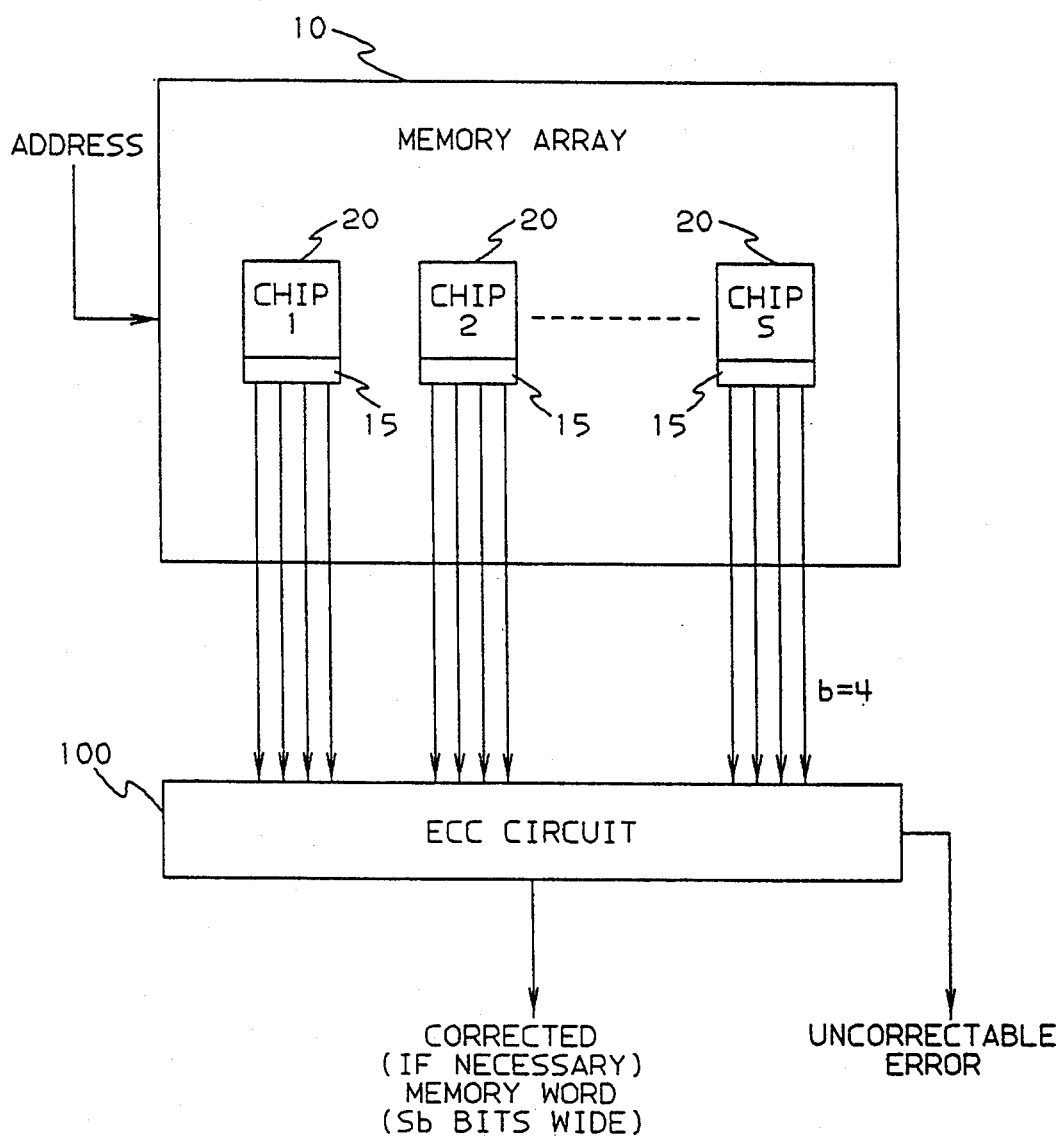
FIG. 6 is a block diagram illustrating the application of the present invention in memory systems.

FIG. 6 illustrates the utilization of the coding method and apparatus described herein in its preferred embodiment in conjunction with a memory array structure. Typically, such memory arrays 10 include individual chips or chip arrays, 1 through S. Such chips typically include a set of output latches 15 which store memory contents provided in response to address signals applied to the array. In particular, in the system shown, it is noted that each chip supplies four (b=4) signals to ECC circuit 100 which is more particularly described in FIG. 7. Each chip is then said to provide b bits to the ECC circuits, which thus receives a total of Sb bits. ECC circuit 100 processes these bits to correct them if necessary and/or to provide an indication that an uncorrectable error (UE) has occurred.

Figure 5:
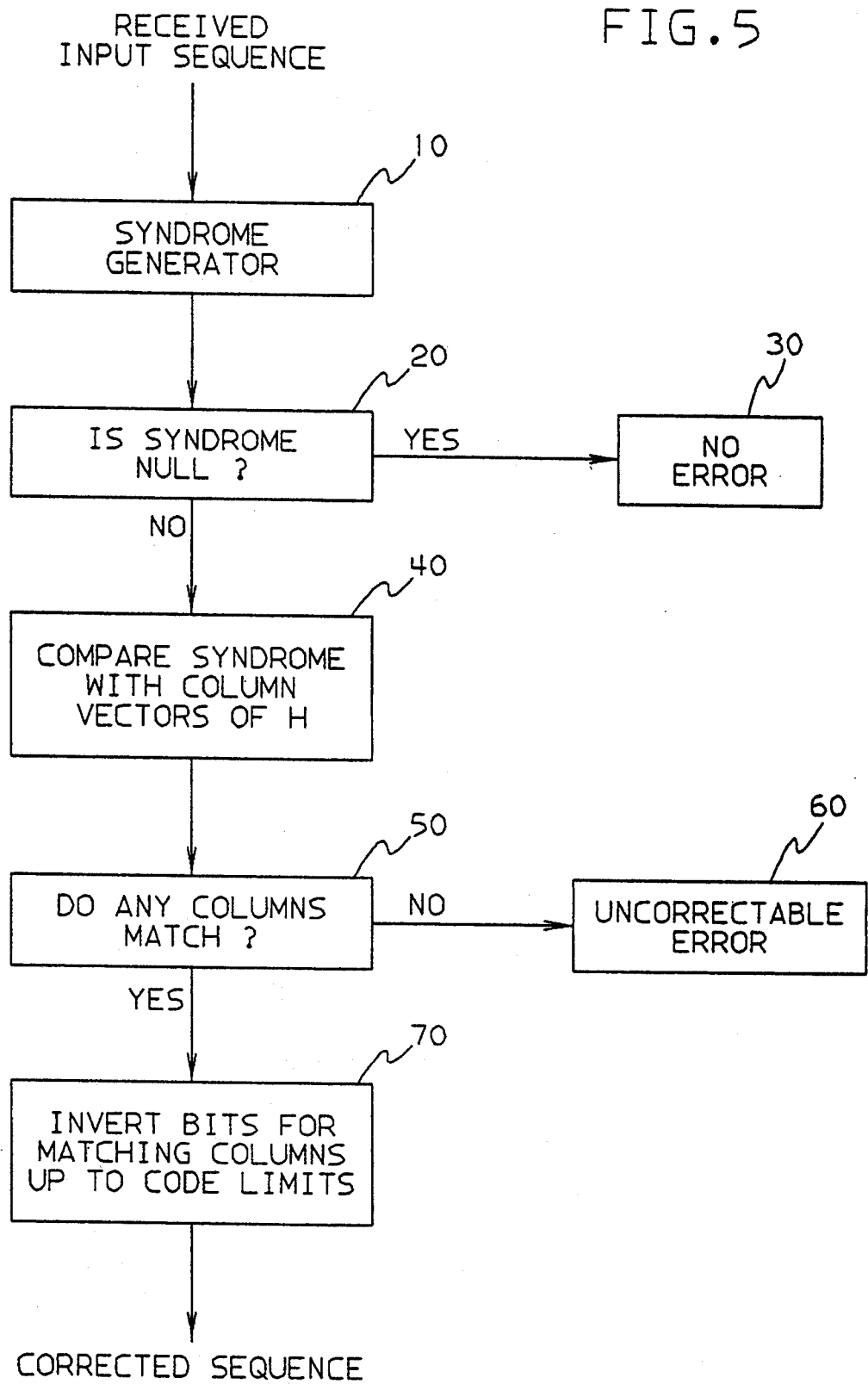
FIG. 5 is a flow chart illustrating the steps employed in detecting and correcting errors associated with sequences coded in accordance with Type III coding methods in further accordance with the present invention.
Figure 7:
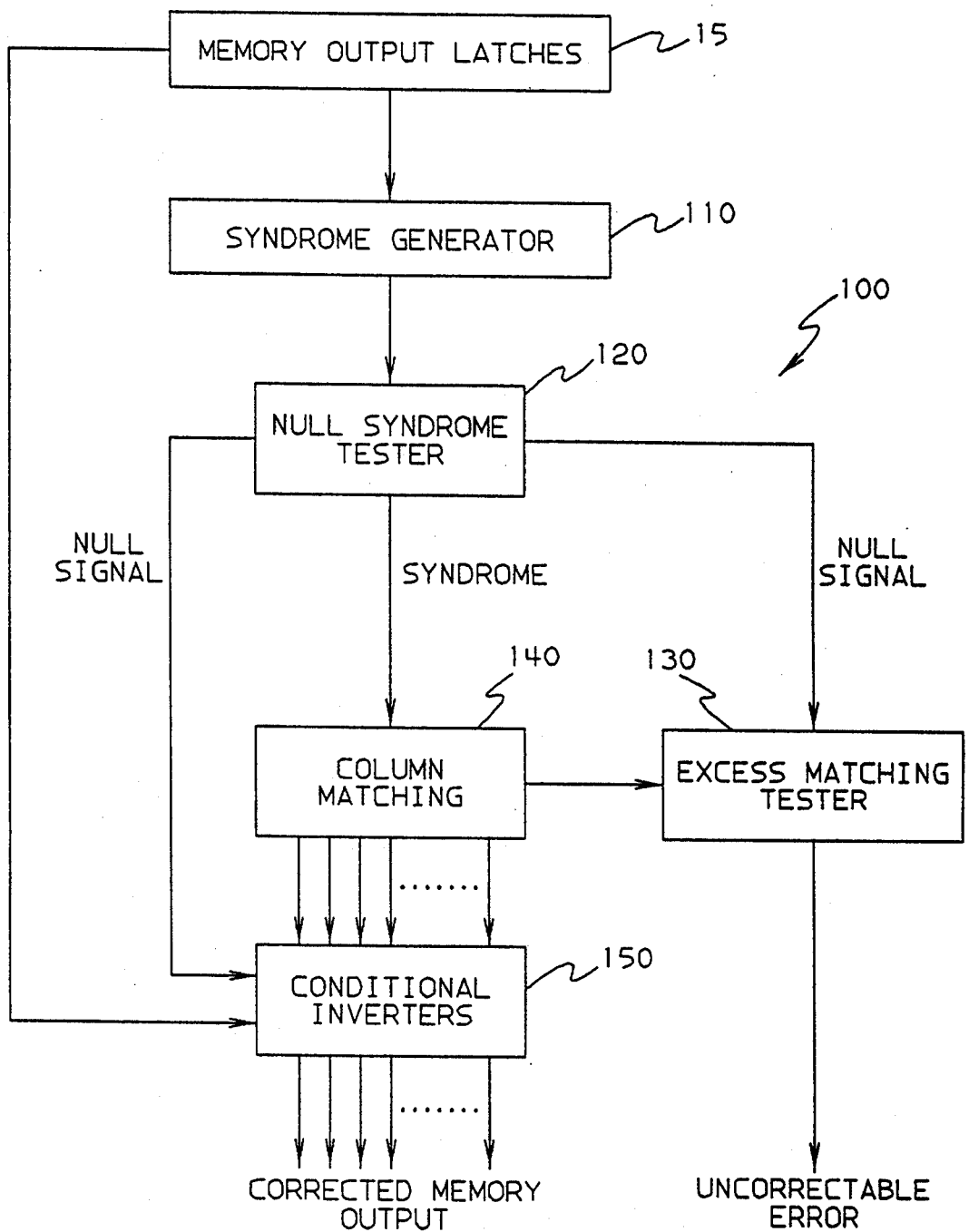
FIG. 7 is a block diagram illustrating an apparatus for carrying out error correction and detection in accordance with Type III coding methods.

An apparatus for carrying out the method illustrated in FIG. 5 is more particularly illustrated in FIG. 7. In particular, the output signal from memory latches 15 is supplied to syndrome generator 110. Specific circuits for carrying out this generation are very well known in the ECC arts and accordingly, it is not necessary to describe them herein. The syndrome is supplied to syndrome tester 120 to determine if the syndrome is null (that is all zeros). If so, a null signal indicator is supplied to (conditional) inverters 150 so as to inhibit any inversion that takes place as a result of subsequent processing. In the event that the syndrome is not null, comparison circuit 140 compares the columns of the Type III encoding parity check matrix with the syndrome to determine corresponding matching positions in the signal sequence to be processed. For columns that are found to match, a corresponding signal is supplied to conditional inverters 150 which typically comprise an array of separate Exclusive-OR gates. Such gates, although described as "Exclusive-OR gates" nonetheless perform a conditional inversion function. It is conditional inversion of the bit sequence from output latches 15 performs the error correction operation. Nonetheless, a null signal from syndrome tester 120 may be employed to inhibit the application of column matching signals for those circumstances for which no error occurs and the syndrome is null. This is typically the situation. Additionally, there is also provided an excess matching tester 130 which operates to provide an uncorrectable error signal. This, for example, may occur if the number of columns which are found to match the syndrome are in excess of the limitations of Type III encoding capabilities, as described herein. Also, it is possible to inhibit the generation of uncorrectable error signal by supplying a null signal indicator from syndrome tester 120 to excess matching tester 130.

From the above, it should be appreciated that a significant error correction mechanism has been provided to the art in general and most particularly to memory system designers who are involved with semiconductor memory systems or other memory systems, in which there is a multiple bit readout from memory array structures, such as chips. In particular, it is seen that the present invention provides a coding method which is in fact capable of detecting all combinations of a single symbol error together with a single bit error in another symbol. It is further seen that the present invention provides Type III codes (as defined herein) which have check bit requirements which are greater than the requirements for a Type I code but which are at the same time less than those required for a Type II code. For example, the minimum number of check bits required for 128 data bits with b=8 bits per symbol is 11 for a Type I code and 24 check bits for a Type II code. However, a Type III code in accordance with the present invention requires only 16 check bits. Accordingly, memory system designers are provided with a valuable design trade-off mechanism. Furthermore, this trade-off mechanism is particularly valuable in memory systems in which a multiple number of bits are read out from a single chip. It is therefore seen that the code described herein provides significant advantages in that its error detection and correction capabilities are commensurate with the failure mechanisms seen in multiple bit readout memory systems.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for encoding input digital electrical signals representing binary data occurring in a block of N bits with S sub-blocks of M bits each, said method comprising the step of transforming by electrical circuit means said input electrical signals representing said N bits of data to produce output digital electrical check bit signals satisfying linear constraint conditions determined by a binary parity check matrix H, which is derived from a binary matrix H*, which represents a Type II code and which includes M by M submatrices arranged in P rows and S columns with the first row of said P rows being M by M identity matrices and wherein the other rows of M by M matrices include M by M zero matrices, M by M identity matrices and M by M matrices $T^i$ where i denotes a non-negative exponent and T is a companion matrix associated with a primitive binary polynomial p(x) of degree M over GF(2), said H matrix being derived from said H* matrix to create a matrix with $S \times b$ columns and $M \times P + (b - M)$ rows where $M + 1 \leq b < 2^M - 1$, said derivation being carried out by:
   (1) replacing the M by M identity matrices in said first row of said matrices with b by b identity matrices;
   (2) replacing said M by M zero matrices with M by b zero matrices; and
   (3) replacing said M by M matrices $T^i$ with M by b augmented matrices whose $j^{th}$ column is the vector of the polynomial $x^{i+j-1}$ modulo p(x)
   and wherein said electrical circuit means is defined by said parity check matrix H.

2. The method of claim 1 in which N is 30, S is 10 and M is 3.

3. The method of claim 1 in which said primitive binary polynomial p(x) is $1 + x + X^3$.

4. The method of claim 1 in which said companion matrix T is:

$$\begin{bmatrix} 0 & 0 & 1 \\ 1 & 0 & 1 \\ 0 & 1 & 0 \end{bmatrix}.$$

5. The method of claim 1 in which said binary parity check matrix H is:

$$\begin{pmatrix}
1000 & 1000 & 1000 & 1000 & 1000 & 1000 & 1000 & 1000 & 1000 & 1000 \\
0100 & 0100 & 0100 & 0100 & 0100 & 0100 & 0100 & 0100 & 0100 & 0100 \\
0010 & 0010 & 0010 & 0010 & 0010 & 0010 & 0010 & 0010 & 0010 & 0010 \\
0001 & 0001 & 0001 & 0001 & 0001 & 0001 & 0001 & 0001 & 0001 & 0001 \\
\overline{0000} & \overline{1001} & \overline{0000} & \overline{1001} & \overline{1011} & \overline{1011} & \overline{0111} & \overline{0111} & \overline{1110} & \overline{1110} \\
0000 & 0101 & 0000 & 0101 & 1110 & 1110 & 1100 & 1100 & 1001 & 1001 \\
0000 & 0010 & 0000 & 0010 & 0111 & 0111 & 1110 & 1110 & 1100 & 1100 \\
\overline{0000} & \overline{0000} & \overline{1001} & \overline{0111} & \overline{0111} & \overline{1110} & \overline{1001} & \overline{1011} & \overline{1011} & \overline{1110} \\
0000 & 0000 & 0101 & 1100 & 1100 & 1001 & 0101 & 1110 & 1110 & 1001 \\
0000 & 0000 & 0010 & 1110 & 1110 & 1100 & 0010 & 0111 & 0111 & 1100
\end{pmatrix}$$

6. The method of claim 1 in which said matrix H is further modified by row operations which tend to place the matrix in a reduced echelon form.

7. A method for transmitting digital information from a first point to a second point in blocks of N bits so as to enhance error correction and detection capabilities, said method comprising the method of transmitting an input electrical signal representing a first plurality, K of information bits and a second plurality, (N−K) of check bits, said signal being generated so that when said signal is considered as an N-tuple binary vector, said vector lies in the null space of an (N−K) by N parity check matrix H which is the parity check matrix for a Type III code.

8. The method of claim 7 in which said parity check matrix H is the matrix shown below:

$$\begin{pmatrix}
1000 & 1000 & 1000 & 1000 & 1000 & 1000 & 1000 & 1000 & 1000 & 1000 \\
0100 & 0100 & 0100 & 0100 & 0100 & 0100 & 0100 & 0100 & 0100 & 0100 \\
0010 & 0010 & 0010 & 0010 & 0010 & 0010 & 0010 & 0010 & 0010 & 0010 \\
0001 & 0001 & 0001 & 0001 & 0001 & 0001 & 0001 & 0001 & 0001 & 0001 \\
\overline{0000} & \overline{1001} & \overline{0000} & \overline{1001} & \overline{1011} & \overline{1011} & \overline{0111} & \overline{0111} & \overline{1110} & \overline{1110} \\
0000 & 0101 & 0000 & 0101 & 1110 & 1110 & 1100 & 1100 & 1001 & 1001 \\
0000 & 0010 & 0000 & 0010 & 0111 & 0111 & 1110 & 1110 & 1100 & 1100 \\
\overline{0000} & \overline{0000} & \overline{1001} & \overline{0111} & \overline{0111} & \overline{1110} & \overline{1001} & \overline{1011} & \overline{1011} & \overline{1110} \\
0000 & 0000 & 0101 & 1100 & 1100 & 1001 & 0101 & 1110 & 1110 & 1001 \\
0000 & 0000 & 0010 & 1110 & 1110 & 1100 & 0010 & 0111 & 0111 & 1100
\end{pmatrix}$$

9. A memory system comprising:
an array of S distinct memory elements each of which produces a b bit wide signal indicative of memory content in response to a specified address; and
Type III error correction code means which receives said signals from said memory array and which corrects and detects errors as per Type III requirements.

10. A method for correcting and detecting errors in received binary electrical signals which are coded in accordance with a Type III parity check matrix, said method comprising the steps of:
generating a syndrome vector signal from said received electrical signals;
determining if the syndrome vector signal is null;
comparing said syndrome signal, in the event that said syndrome is not null, with columns of said Type III parity check matrix; and
inverting bits in said received electrical signal corresponding to matching columns from said comparing step.

11. The method of claim 10 further comprising the step of supplying an uncorrectable error signal upon the condition that no columns match as a result of said comparing step.

12. An apparatus for correcting and detecting errors in received binary electrical signals which are coded in accordance with a Type III parity check matrix, said apparatus comprising:
a syndrome vector generator for generating a syndrome vector signal from said received electrical signals;
means for determining if said generated syndrome vector signal is null;
comparison means for comparing non-null syndrome signals with columns of said Type III parity check matrix; and
inverting means for inverting bits in said received electrical signal corresponding to matching column indications provided by said comparison means.

13. The apparatus of claim 12 further including means to provide an uncorrectable error condition indication in the event that said syndrome signal is not null and said comparison means does not provide a column match indication.

14. An apparatus for encoding input digital electrical signals representing binary data occurring in a block of N bits with S sub-blocks of M bits each, said apparatus comprising an electrical circuit which receives said input electrical signals representing said N bits of data to produce output digital electrical check bit signals, said electrical circuit implementing linear binary constraint conditions determined by a binary parity check matrix H, which is derived from a binary matrix H*, which represents a Type II code and which includes M by M submatrices arranged in P rows and S columns with the first row of said P rows being M by M identity matrices and wherein the other rows of M by M matrices include M by M zero matrices, M by M identity matrices and M by M matrices $T^i$ where i denotes a non-negative exponent and T is a companion matrix associated with a primitive binary polynomial p(x) of degree M over GF(2), said H matrix being derived from said H* matrix to create a matrix with S×b columns and M×P+(b−M) rows where M+1≤b< $2^M-1$, said derivation being carried out by:
(1) replacing the M by M identity matrices in said first row of said matrices with b by b identity matrices;
(2) replacing said M by M zero matrices with M by b zero matrices; and
(3) replacing said M by M matrices $T^i$ with M by b augmented matrices whose $j^{th}$ column is the vector of the polynomial $x^{i+j-1}$ modulo p(x)

and wherein said electrical circuit means is determined by said parity check matrix H.

* * * * *